US009300891B2

(12) United States Patent
Isono et al.

(10) Patent No.: US 9,300,891 B2
(45) Date of Patent: Mar. 29, 2016

(54) SOLID-STATE IMAGING DEVICE AND METHOD OF MANUFACTURING THE SAME

(71) Applicant: PANASONIC CORPORATION, Kadoma-shi (JP)

(72) Inventors: Shunsuke Isono, Toyama (JP); Tetsuya Ueda, Toyama (JP); Tetsuo Satake, Toyama (JP); Takashi Hyakushima, Toyama (JP); Kenji Taki, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 65 days.

(21) Appl. No.: 14/488,088

(22) Filed: Sep. 16, 2014

(65) Prior Publication Data
US 2015/0002719 A1 Jan. 1, 2015

Related U.S. Application Data

(63) Continuation of application No. PCT/JP2013/006847, filed on Nov. 21, 2013.

(30) Foreign Application Priority Data

Dec. 28, 2012 (JP) ................................ 2012-287603

(51) Int. Cl.
*H04N 5/335* (2011.01)
*H01L 27/00* (2006.01)
(Continued)

(52) U.S. Cl.
CPC .......... *H04N 5/372* (2013.01); *H01L 27/14683* (2013.01); *H01L 27/307* (2013.01)

(58) Field of Classification Search
CPC .. H01L 27/14647; H01L 27/14665–27/14676; H01L 27/307

USPC ........ 348/294, 308, 311; 250/208.1; 257/291, 257/292, 294, 440, 443–448, 40
See application file for complete search history.

(56) References Cited

U.S. PATENT DOCUMENTS 7,683,408 B2 3/2010 Hong
7,888,759 B2 2/2011 Ihama
(Continued)

FOREIGN PATENT DOCUMENTS

JP 2007-059516 A 3/2007
JP 2008-003061 A 1/2008
(Continued)

OTHER PUBLICATIONS

International Search Report PCT/JP2013/006847 dated Feb. 25, 2014.

*Primary Examiner* — Sinh Tran
*Assistant Examiner* — Xi Wang
(74) *Attorney, Agent, or Firm* — McDermott Will & Emery LLP

(57) ABSTRACT

A solid-state imaging device according to the present disclosure includes: a pixel region which includes: pixel plugs formed above and electrically connected to a charge accumulation and diffusion layer, the pixel plugs respectively corresponding to pixels; lower pixel electrodes formed on and electrically connected to the pixel plugs, respectively, the lower pixel electrodes respectively corresponding to the pixels; an organic photoelectric conversion film formed on and electrically connected to the lower pixel electrodes; and an upper pixel electrode formed on and electrically connected to the organic photoelectric conversion film, and in which top surfaces of a global interconnect, a light shielding film, and a first AI pad formed in an uppermost layer of a multilayer interconnect structure disposed in a peripheral region is above a bottom surface of the organic photoelectric conversion film, the peripheral region being peripheral to the pixel region.

15 Claims, 10 Drawing Sheets

(51) Int. Cl.
*H01L 31/062* (2012.01)
*H04N 5/372* (2011.01)
*H01L 27/30* (2006.01)
*H01L 27/146* (2006.01)

(56) References Cited

U.S. PATENT DOCUMENTS

| | | | |
|---|---|---|---|
| 8,232,616 | B2 | 7/2012 | Maehara et al. |
| 8,298,855 | B2 | 10/2012 | Ihama |
| 8,378,397 | B2 | 2/2013 | Nakatani et al. |
| 8,390,036 | B2 | 3/2013 | Goto |
| 8,704,281 | B2 | 4/2014 | Maehara et al. |
| 2006/0181629 | A1* | 8/2006 | Miyashita ......... H01L 27/14623 348/311 |
| 2006/0249762 | A1 | 11/2006 | Rieve et al. |
| 2007/0045760 | A1 | 3/2007 | Ihama |
| 2007/0298975 | A1 | 12/2007 | Ihama et al. |
| 2008/0303071 | A1 | 12/2008 | Hong |
| 2011/0049591 | A1* | 3/2011 | Nakatani ............... H01L 27/307 257/292 |
| 2011/0049661 | A1 | 3/2011 | Maehara et al. |
| 2011/0049665 | A1 | 3/2011 | Goto |
| 2011/0097839 | A1 | 4/2011 | Ihama |
| 2011/0128429 | A1* | 6/2011 | Endo ................... H01L 27/1463 348/308 |
| 2011/0272772 | A1* | 11/2011 | Kokubun .......... H01L 27/14632 257/432 |
| 2011/0285883 | A1* | 11/2011 | Goto ................. H01L 27/14667 348/294 |
| 2012/0161270 | A1 | 6/2012 | Maehara et al. |
| 2012/0305926 | A1 | 12/2012 | Nakatani et al. |
| 2013/0248862 | A1* | 9/2013 | Inoue ................. H01L 31/0224 257/48 |

FOREIGN PATENT DOCUMENTS

| | | |
|---|---|---|
| JP | 2008-306155 A | 12/2008 |
| JP | 4444371 B1 | 1/2010 |
| JP | 2011-071481 A | 4/2011 |

* cited by examiner

FIG. 6
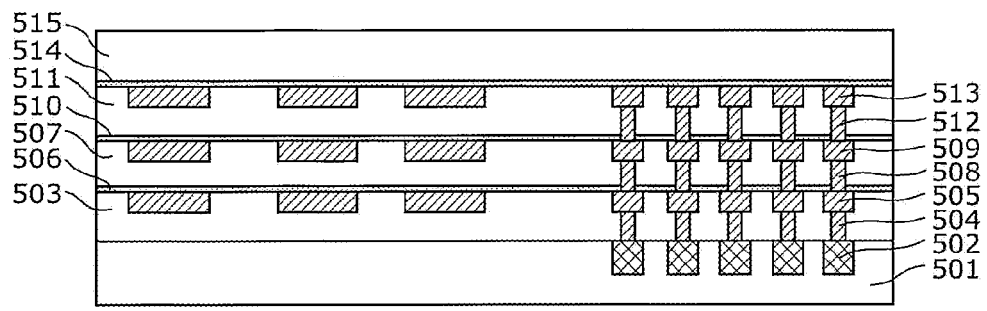
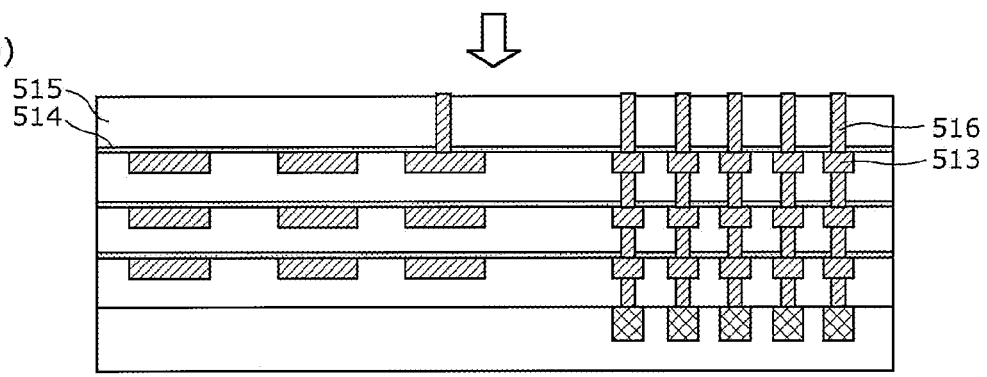
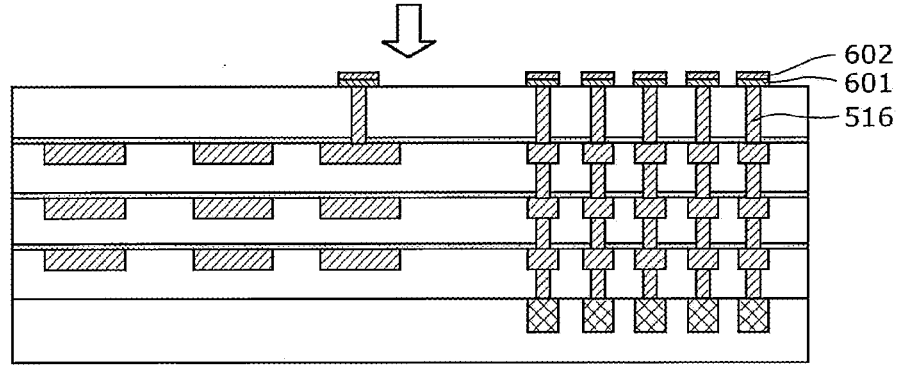
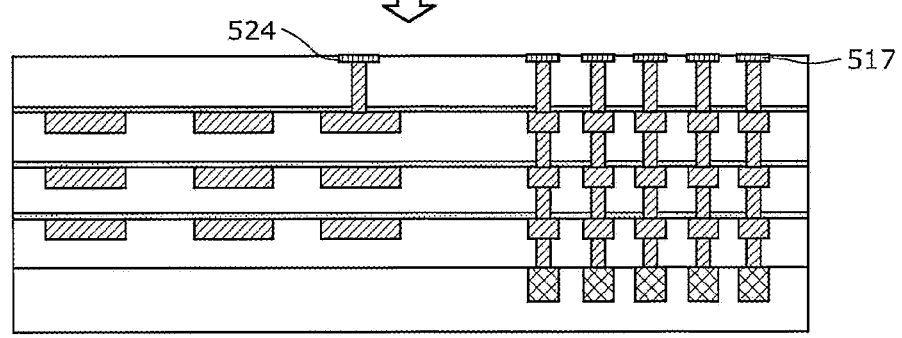

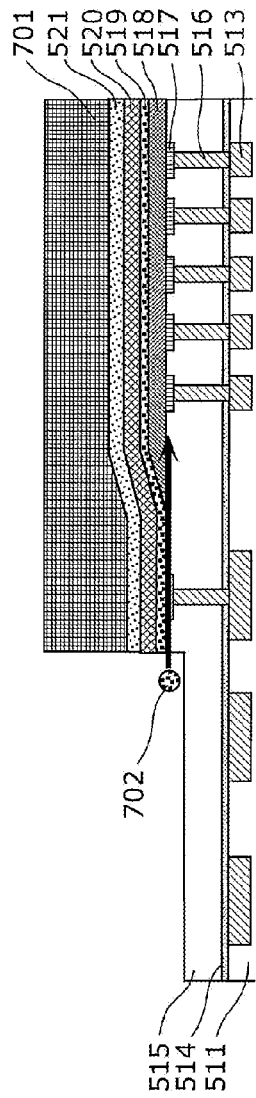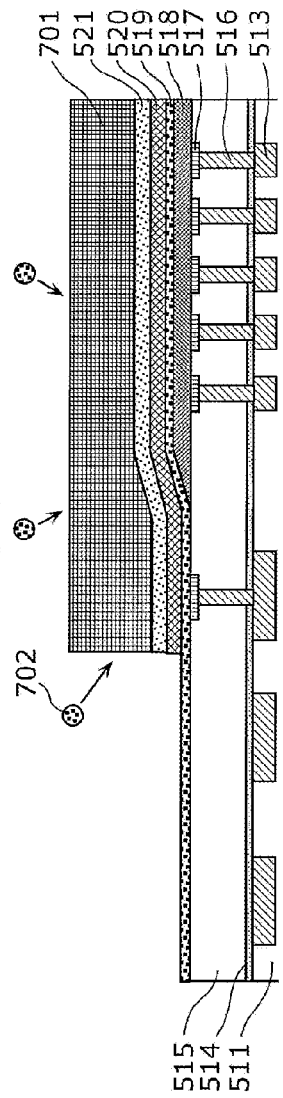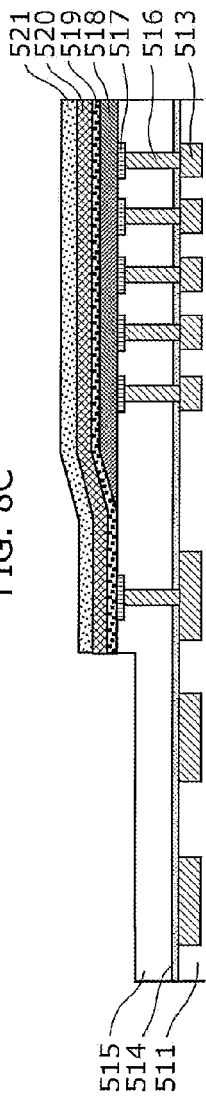

SOLID-STATE IMAGING DEVICE AND METHOD OF MANUFACTURING THE SAME

CROSS REFERENCE TO RELATED APPLICATIONS

This is a continuation application of PCT International Application No. PCT/JP2013/006847 filed on Nov. 21, 2013, designating the United States of America, which is based on and claims priority of Japanese Patent Application No. 2012-287603 filed on Dec. 28, 2012. The entire disclosures of the above-identified applications, including the specifications, drawings and claims are incorporated herein by reference in their entirety.

FIELD

One or more exemplary embodiments disclosed herein relate to a solid-state imaging device.

BACKGROUND

The pixel sizes of image sensors were 3 µm around 2000 and 2 µm or less in 2007. Furthermore, image sensors having a pixel size of 1.1 µm were put into practical use in 2012. With further miniaturization of pixels at this pace, image sensors having a pixel size of 1 µm or less are expected to be put into practical use within the next few years.

However, even with the latest fine processing technology, a space available for a photodiode is limited (far smaller than 50% of the area of a pixel). This is because most of the area of the pixel is occupied by electronic components (such as a field-effect transistor) necessary for driving a drive circuit.

To solve this problem, a patent literature introduced below discloses a solid-state imaging device including, as an upper layer, a photoelectric conversion film for capturing light and converting the light into an electrical signal.

FIG. 9 is a cross-sectional view of the conventional solid-state imaging device disclosed in the patent literature. The solid-state imaging device illustrated in FIG. 9 includes wells formed in a silicon substrate for accumulating charges, an insulating film above the wells, pixel electrodes 805 on the surface of the insulating film, an organic photoelectric conversion film 802 which is above the insulating film and connected to the pixel electrodes 805, and a counter electrode 804, a protective film 806, an electrode connected to the counter electrode 803, and a peripheral pad 801.

CITATION LIST

Patent Literature

Japanese Unexamined Patent Application Publication No. 2007-59516

SUMMARY

Technical Problem

In the conventional solid-state imaging device, a photoelectric conversion film (hereinafter, referred to as organic photoelectric conversion film) is formed with an organic material. However, the photoelectric conversion film generally has low resistance to temperature, oxygen, and ultraviolet rays (plasma). Thus, when exposed to the environment of a high temperature, a high oxygen concentration, and ultraviolet irradiation (plasma irradiation), the organic photoelectric conversion film is damaged. Here, the damage to the organic photoelectric conversion film means an increase in a leakage current or a degradation in photoelectric conversion efficiency due to a change in film composition of the organic photoelectric conversion film.

To avoid the above damage, in process subsequent to the process of forming the organic photoelectric conversion film in manufacturing the conventional solid-state imaging device, it is necessary to avoid a high temperature (200° C. or above), a high oxygen concentration (an oxygen concentration of 100 ppm or above), and ultraviolet irradiation (a plasma emission wavelength of 350 nm or less). Thus, in process subsequent to the process of forming the organic photoelectric conversion film 802 in manufacturing the conventional solid-state imaging device disclosed in the patent literature, a shadow mask method is used which does not require lithography or dry etching.

However, the method of manufacturing the conventional solid-state imaging device disclosed in the patent literature has the following problem. Characteristic degradation caused by electrical color mixture occurs due to crosstalk caused by a capacitance formed by a pixel electrode 805 and a interconnect plug which electrically connects a well and the pixel electrode 805, between adjacent pixels.

Solution to Problem

To solve the above problem, a solid-state imaging device according to an aspect of the present invention includes: a pixel region in which a plurality of pixels are disposed in a matrix above a semiconductor substrate; and a peripheral region in which a multilayer interconnect structure for driving the plurality of pixels is formed, the peripheral region being peripheral to the pixel region in a plan view of the semiconductor substrate, in which the pixel region includes: a charge accumulation and diffusion layer in the semiconductor substrate; a plurality of pixel plugs formed above and electrically connected to the charge accumulation and diffusion layer, the plurality of pixel plugs respectively corresponding to the plurality of pixels; a plurality of lower pixel electrodes formed on and electrically connected to the plurality of pixel plugs, respectively, the plurality of lower pixel electrodes respectively corresponding to the plurality of pixels; a photoelectric conversion film formed on and electrically connected to the plurality of lower pixel electrodes; and an upper pixel electrode formed on and electrically connected to the photoelectric conversion film, and a top surface of an interconnect formed in an uppermost layer of the multilayer interconnect structure disposed in the peripheral region is above a bottom surface of the photoelectric conversion film.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 6 is a cross-sectional view illustrating the first process in a method of manufacturing the solid-state imaging device according to the embodiment.

FIG. 8A is a cross-sectional view illustrating a condition after an upper pixel electrode is dry-etched with a resist mask.

FIG. 8B is a cross-sectional view illustrating a condition when the resist mask is removed by ashing.

FIG. 8C is a cross-sectional view illustrating a condition after the upper pixel electrode is dry-etched, using upper-layer insulating films as masks.

Figure 1:
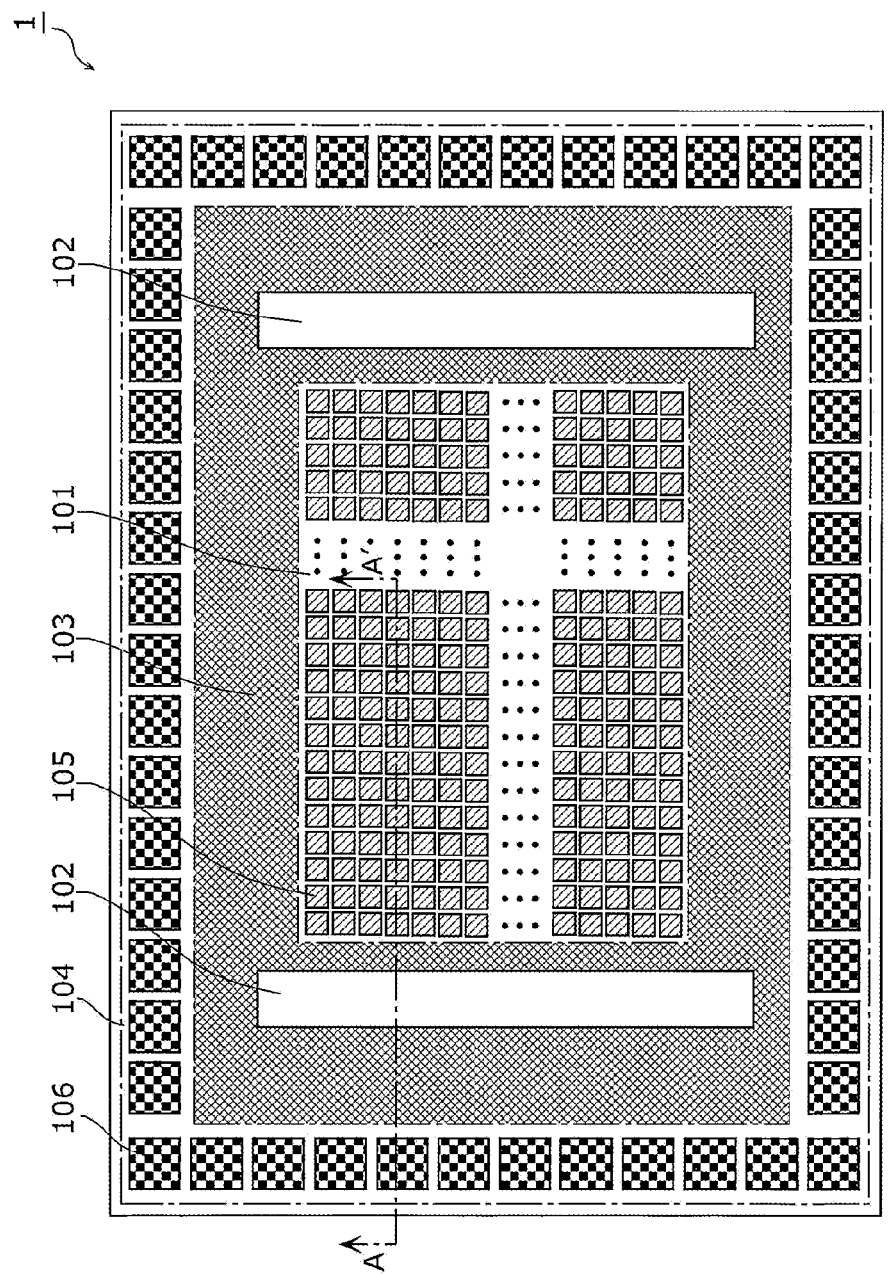
FIG. 1 illustrates a plane structure of a solid-state imaging device according to the embodiment.

DESCRIPTION OF EMBODIMENT (Underlying Knowledge Forming Basis of the Present Disclosure)

In a solid-state imaging device including a semiconductor substrate in which a photodiode (photoelectric conversion unit) is provided, a crystal silicon having a thickness of around 3.5 μm is necessary to mostly absorb green light with a wavelength of around 550 nm which is used to define the sensitivity of the photodiode, and photoelectrically convert the light. Therefore, the depth of the photodiode to be formed in the semiconductor substrate needs to be around 3.5 μm. However, if the plane size of a pixel is 1 μm, it is extremely difficult to form a photodiode having a depth of around 3.5 μm. If the photodiode having a depth of around 3.5 μm could be formed, light is obliquely incident on the photodiodes of adjacent pixels with high possibility. In a normal color image sensor, pixels corresponding to RGB are adjacently arranged. Thus, when light is obliquely incident on the photodiodes of the adjacent pixels, optical color mixture occurs. This is a major problem. Forming a photodiode more shallowly to prevent the color mixture decreases the absorption efficiency of green light, thereby degrading the sensitivity of the image sensor. A pixel size decreases in miniaturization of a pixel, thereby decreasing sensitivity per pixel. Thus, the problem of a decrease in optical absorption efficiency also arises.

The solid-state imaging device according to the embodiment of the present disclosure solves the above problems. The solid-state imaging device has a two-layered hybrid structure. In this structure, as an upper layer, a photoelectric conversion film captures light and converts the light into an electrical signal. A silicon-based CMOS circuit in the lower layer externally extracts the electrical signal. Theoretically, this allows 100% of a pixel space to be available for the photodiode for incident light. Furthermore, the thickness of the photoelectric conversion film can be decreased by employing a material having an absorption coefficient higher than silicon for the upper-layer photoelectric conversion film. This can prevent light from being obliquely incident on the photodiodes of adjacent pixels.

Moreover, the solid-state imaging device according to the embodiment of the present disclosure has a two-layered hybrid structure described above. Thus, the solid-state imaging device can be easily made by only forming a photoelectric conversion layer above a normal logic CMOS.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment

[Plane Structure of Solid-state Imaging Device]

The following describes details of the solid-state imaging device according to the present embodiment with reference to the drawings.

FIG. 1 illustrates a plane structure of the solid-state imaging device according to the present embodiment. A solid-state imaging device 1 illustrated in FIG. 1 includes a pixel region 101, counter electrode regions 102, a peripheral circuit region 103, and a peripheral pad region 104. In the pixel region 101, lower pixel electrodes 105 are arranged in an array, and pixels are arranged in a matrix above a semiconductor substrate. Moreover, in the peripheral pad region 104, peripheral pads 106 are arranged in an array. The counter electrode regions 102 are regions for applying voltages to an upper pixel electrode. The peripheral pad region 104, the peripheral circuit region 103, and the counter electrode region 102 are the peripheral regions of the pixel region 101. In the peripheral regions, multilayer interconnect structure for driving pixels is formed.

[Structure Comparison Examples of Solid-state Imaging Devices]

Figure 2A:
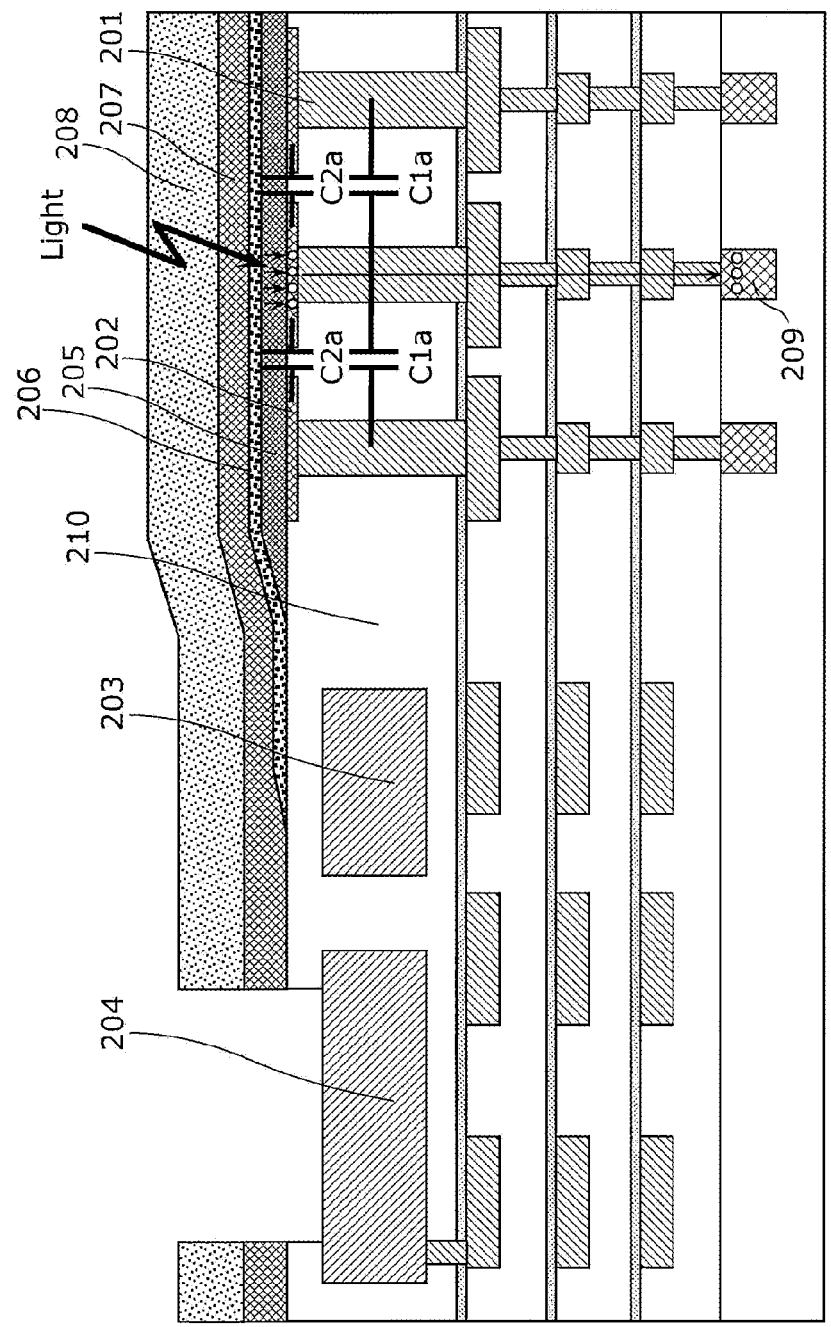
FIG. 2A is a cross-sectional view of the structure of a solid-state imaging device according to a first comparison example.
Figure 2B:
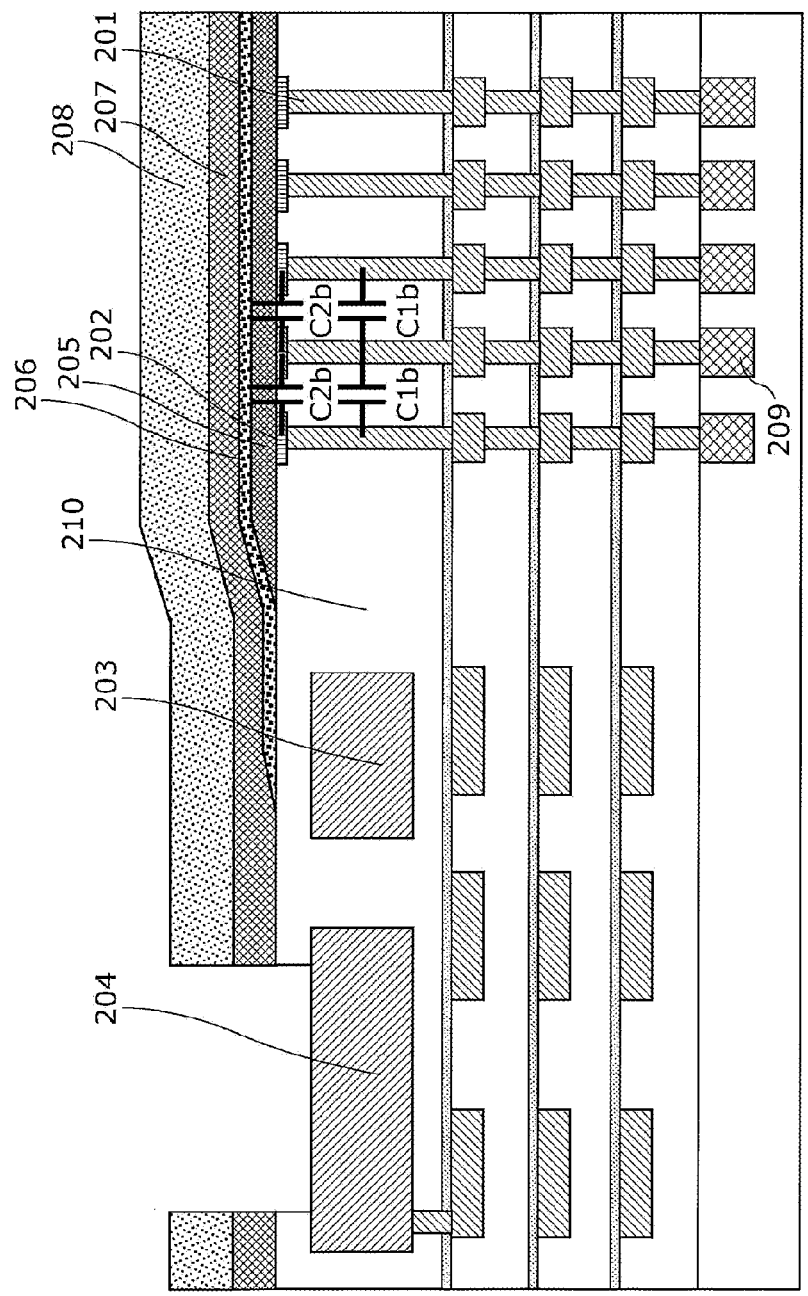
FIG. 2B is a cross-sectional view of the structure of a solid-state imaging device having a finer pixel-cell pitch according to a second comparison example.
Figure 3:
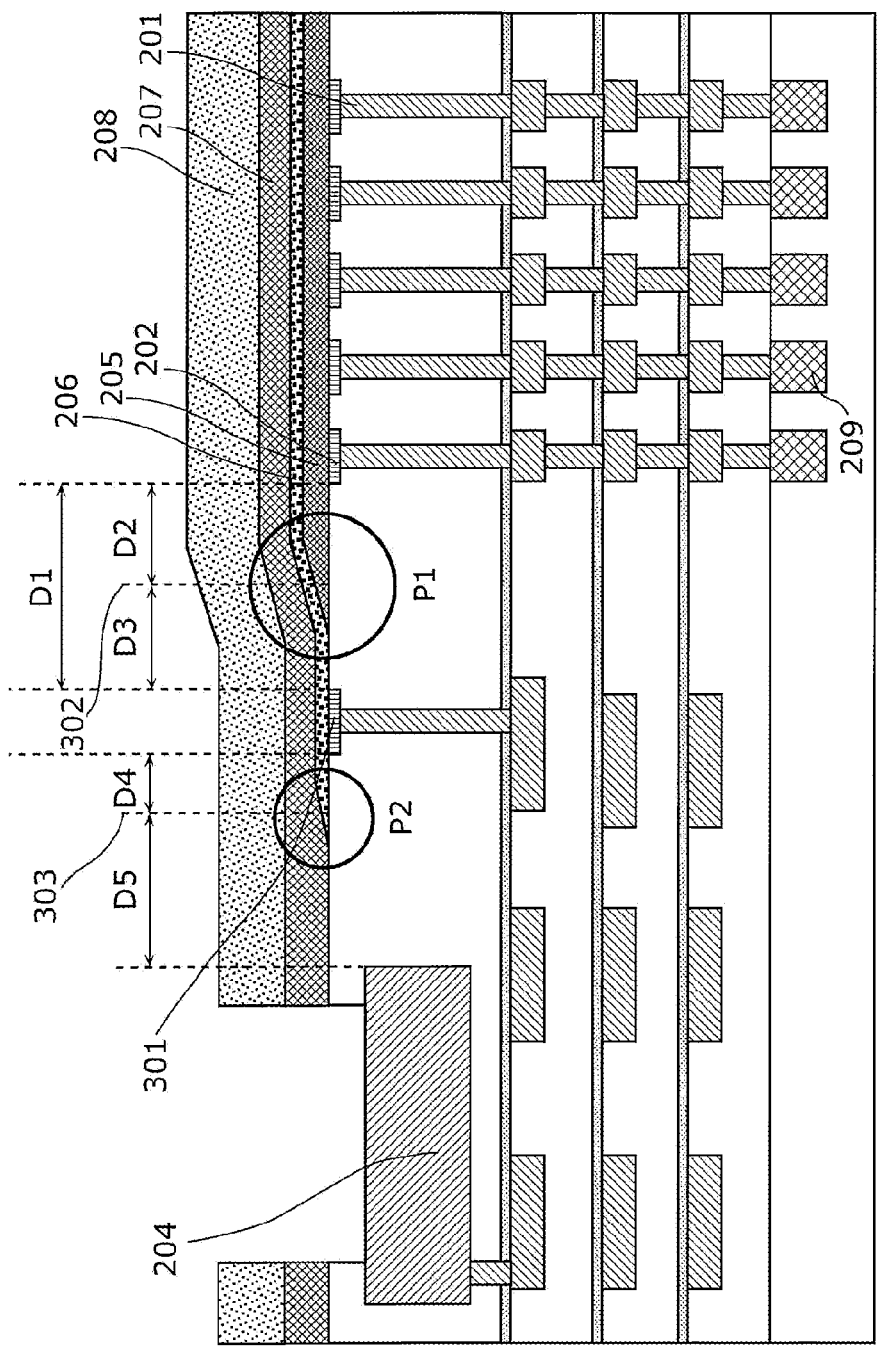
FIG. 3 is a cross-sectional view of the structure of a solid-state imaging device in which a photoelectric conversion film is formed by a shadow mask method, according to a third comparison example.

To facilitate understanding of the solid-state imaging device according to the present embodiment, the following describes comparison examples of solid-state imaging devices including general photoelectric conversion films, with reference to FIGS. 2A, 2B, and 3.

FIG. 2A is a cross-sectional view of the structure of a solid-state imaging device according to a first comparison example. FIG. 2B is a cross-sectional view of the structure of a solid-state imaging device with a finer pixel cell pitch according to a second comparison example. Moreover, FIG. 3 is a cross-sectional view of the structure of a solid-state imaging device in which a photoelectric conversion film is formed by a shadow mask method, according to a third comparison example.

FIG. 2A illustrates that light incident from above is incident on an organic photoelectric conversion film 205 via a second passivation film 208, a first passivation film 207, and an upper pixel electrode 206. The organic photoelectric conversion film 205 photoelectrically converts incident light and generates charges in the state in which appropriate voltages are applied from the upper pixel electrode 206 and lower pixel electrodes 202. Here, a potential difference between the upper pixel electrode 206 and the lower pixel electrode 202 is a voltage to be applied to the organic photoelectric conversion film 205.

The charges (illustrated as white circles in FIG. 2A) generated by the organic photoelectric conversion film 205 are transferred from the lower pixel electrodes 202 via pixel electrode connection plugs 201, and accumulated in charge accumulation units 209. An opening and closing operation by, for example, a transistor element in a read circuit outputs the charges to the outside as signals at the appropriate times.

Thus, unlike a solid-state imaging device including a photodiode (photoelectric conversion unit) in a semiconductor substrate, a photoelectric conversion unit and a charge accumulation unit are different units in the solid-state imaging device including a photoelectric conversion film. Therefore, it is necessary to transport charges generated by the photoelectric conversion unit to the charge accumulation unit. Crosstalk occurs due to a capacitance between adjacent interconnects in a normal multilayer interconnect structure. Likewise, in a color image sensor, pixels corresponding to RGB are adjacently disposed, and crosstalk occurs due to a capacitance between the adjacent pixels in the solid-state imaging device including a general photoelectric conversion film, according to the first comparison example. This crosstalk appears as characteristic degradation due to electrical color mixture. This is a major problem.

In the solid-state imaging device according to the first comparison example, interconnect layers below the pixel electrode connection plugs connecting the photoelectric conversion unit and the uppermost interconnect layer are shielded by interconnects, thereby not affecting a capacitance (coupling capacitance) between adjacent pixels (this condition is not illustrated in the figure). Therefore, a capacitance between the pixel electrode connection plugs and a capacitance between the lower pixel electrodes should be taken into account.

In FIG. 2A, a global interconnect 203 and a peripheral pad 204 formed using lithography and dry etching are formed prior to forming the organic photoelectric conversion film 205. This is to avoid a high temperature, a high oxygen concentration, and ultraviolet irradiation (plasma irradiation) in process subsequent to the process of forming the organic photoelectric conversion film 205. That is, the global interconnect 203 and the peripheral pad 204 are formed prior to forming the lower pixel electrodes 202 and the pixel electrode connection plugs 201 connecting the photoelectric conversion unit and the uppermost interconnect layer.

The global interconnect 203 and the peripheral pad 204 are disposed in an interlayer insulating film 210 in which the pixel electrode connection plugs 201 are also formed. From this arrangement relationship, to avoid the exposure of the global interconnect 203 and the peripheral pad 204, it is difficult to make the heights of the pixel electrode connection plugs 201 1.5 times or less the heights of the global interconnect 203 and the peripheral pad 204.

In the generation of a pixel cell pitch of 2.0 µm or greater, even if the heights of the pixel electrode connection plugs 201 are high, the pixel electrode connection plugs 201 have a wide distance therebetween. Therefore, a capacitance (C1$a$+C2$a$) between adjacent pixel electrodes is significantly smaller than the total capacitance of a pixel electrode. Therefore, there is less degradation of color mixture characteristics which is caused by a capacitance between the adjacent pixels due to the pixel electrode connection plugs 201.

Meanwhile, the following assumes the generation of a finer pixel cell pitch of less than 2.0 µm, as the solid-state imaging device according to the second comparison example illustrated in FIG. 2B. The heights of the global interconnect 203 and the peripheral pad 204 do not change for satisfying a power supply function and mounting requirements. Thus, the heights of the pixel electrode connection plugs 201 do not change, but only a distance between the pixel electrode connection plugs 201 decreases. Therefore, a capacitance (C1$b$+C2$b$) between adjacent pixels increases, thereby rendering the degradation of electrical color mixture characteristics due to crosstalk between the adjacent pixels remarkable.

The lateral size of the pixel electrode connection plug 201 does not depend on the global interconnect 203 or the peripheral pad 204. Thus, the lateral size of the pixel electrode connection plug 201 can be reduced, and a slight decrease in capacitance between the adjacent pixels can be expected. However, the size in the height direction of the pixel electrode connection plug 201 depends on the heights of the global interconnect 203 and the peripheral pad 204. Thus, the size in the height direction of the pixel electrode connection plug 201 is constant regardless of a pixel cell pitch. That is, the aspect ratio (longitudinal size/lateral size) of the pixel electrode connection plug 201 further increases. This makes plug processing and the embedment of a metal material significantly difficult.

Furthermore, to directly form the organic photoelectric conversion film 205 without contact with an electrode connected to a counter electrode 301, using the shadow mask method, as shown in the solid-state imaging device illustrated in FIG. 3 according to the third comparison example, a distance D from the lower pixel electrode 202 closest to the electrode connected to a counter electrode 301 is, for example, 300 µm or greater. Specifically, a distance D2 between an end portion 302 of the organic photoelectric conversion film 205 and the lower pixel electrode 202 closest to the end portion 302 needs to be 150 µm or greater. Moreover, a distance D3 between the end portion 302 and the electrode connected to a counter electrode 301 needs to be 150 µm or greater.

Moreover, a similar explanation can be applied to the upper pixel electrode 206 formed by the shadow mask method. That is, a distance D4 between an end portion 303 of the upper pixel electrode 206 and the electrode connected to a counter electrode 301 needs to be 150 µm or greater. A distance D5 between the end portion 303 and the peripheral pad 204 needs to be 150 µm or greater. The above requirements are required for the following reasons. If the organic photoelectric conversion film 205 and the upper pixel electrode 206 are formed by the shadow mask method, the organic photoelectric conversion film 205 and the upper pixel electrode 206 become thinner toward the ends as the end faces are inclined as shown in P1 and P2 in FIG. 3. In addition, since mask superposition is mechanically performed without using normal lithography, the accuracy of superposition of the photoelectric conversion film 205 and the pixel electrode 206 is poor.

As described above, in the solid-state imaging devices according to the first to third comparison examples, the distance between the peripheral pad 204 and the electrode connected to a counter electrode 301 and the distance between the lower pixel electrode 202 and the electrode connected to a counter electrode 301 are long. This increases a voltage decline when, for example, a power supply voltage is supplied, thereby preventing a pixel cell from operating sufficiently.

[Structure of Solid-state Imaging Device in Present Disclosure]

The following describes in detail the structure of a solid-state imaging device in the present disclosure in which the above problems are solved.

Figure 4:
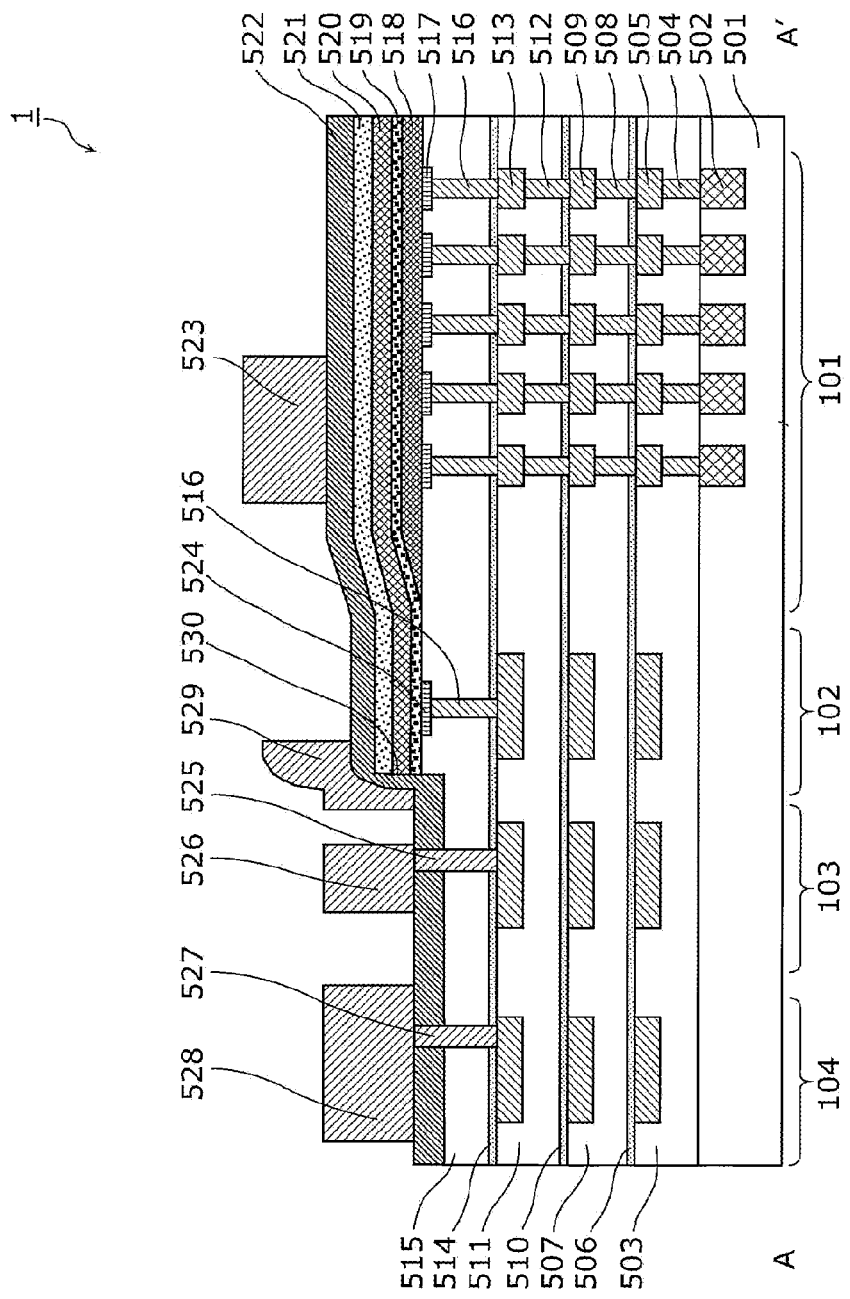
FIG. 4 is a cross-sectional view of the structure of the solid-state imaging device according to the embodiment.

FIG. 4 is a cross-sectional view of the structure of the solid-state imaging device according to the present embodiment. Specifically, FIG. 4 is a cross-sectional view of the solid-state imaging device taken along the line A-A' in FIG. 1. It should be noted that with reference to FIG. 4, the following description focuses on differences between FIGS. 2A, 2B, and 3. Therefore, structures and operations not mentioned below are the same as the structures and operations of the solid-state imaging devices described with reference to FIGS. 2A, 2B, and 3.

In FIG. 4, charge accumulation and diffusion areas 502 are formed in a silicon substrate 501 in the pixel region 101. The structure of the charge accumulation and diffusion area 502 is basically the same as the structure of a fine CMOS transistor used in, for example, a system LSI. However, the charge accumulation and diffusion area 502 is designed to suppress a leakage current infinitely. Moreover, a first insulating film 503, first plugs 504, and a first Cu layer 505 are formed above the silicon substrate 501 in which the charge accumulation and diffusion areas 502 are formed.

A second insulating film 506 and a third insulating film 507 are formed above the first insulating film 503. Second plugs 508 and a second Cu layer 509 are formed in the second insulating film 506 and the third insulating film 507.

A fourth insulating film 510 and a fifth insulating film 511 are formed above the third insulating film 507. Third plugs 512 and a third Cu layer 513 are formed in the fourth insulating film 510 and the fifth insulating film 511.

A multilayer interconnect structure of three layers are formed by the first plugs 504, the first Cu layer 505, the second plugs 508, the second Cu layer 509, the third plugs 512, and the third Cu layer 513. These layers and plugs are interconnected with the charge accumulation and diffusion areas 502, and enable a circuit operation. The present embodiment describes the example of the three Cu layers. However, the number of layers can be selected as necessary.

With reference to the cross-sectional view of FIG. 4, the following describes the four regions illustrated in FIG. 1: the pixel region 101, the counter electrode region 102, the peripheral circuit region 103, and the peripheral pad region 104. It should be noted that the structure below the third Cu layer 513 is common in the four regions.

The pixel region 101 will be described.

A sixth insulating film 514 and a seventh insulating film 515 are formed above the third Cu layer 513. Pixel plugs 516 respectively corresponding to pixels are formed in the sixth insulating film 514 and the seventh insulating film 515.

Lower pixel electrodes 517 respectively corresponding to the pixels are disposed in an array above the pixel plugs 516, and electrically connected to the pixel plugs 516. In such a manner, the pixel region 101 is formed. An organic photoelectric conversion film 518 which is formed on and is electrically connected to the lower pixel electrodes 517 is formed to cover the lower pixel electrodes 517. An upper pixel electrode 519, an eighth insulating film 520, and a ninth insulating film 521, which are electrically connected to the organic photoelectric conversion film 518, are stacked above the organic photoelectric conversion film 518. Furthermore, a tenth insulating film 522 is formed to cover the ninth insulating film 521. The tenth insulating film 522 covers the end faces of the upper pixel electrode 519 and a protective film (the eighth insulating film 520 and the ninth insulating film 521), thereby preventing the electrical short circuit between the upper pixel electrode 519 and each of a power supply line, a pad, and a light shielding film.

In the present embodiment, titanium nitride (TiN) is used for the lower pixel electrodes 517, and indium tin oxide (In2-xSnxO3 (ITO)) is used for the upper pixel electrode 519. Moreover, aluminum oxide (AlO) is used for the eighth insulating film 520. Silicon oxide nitride (SiON) is used for the ninth insulating film 521 and the tenth insulating film 522. Here, titanium (Ti) or a chemical compound of Ti is used for the material of the lower pixel electrodes 517. Because of its chemical stability, Ti is preferable as a material in contact with an organic film, and compatible with Si process (a general semiconductor manufacturing technology).

Furthermore, a light shielding film 523 is formed on a portion of the tenth insulating film 522 to cover particular lower pixel electrodes 517. This allows the light shielding film 523 to partially shield the pixels.

The counter electrode region 102 will be described.

The pixel plugs 516 are formed in the sixth insulating film 514 and the seventh insulating film 515 stacked above the third Cu layer 513. A counter electrode 524 in contact with the upper pixel electrode 519 is formed on the pixel plug 516.

The upper pixel electrode 519 is formed on the counter electrode 524 via which a voltage can be applied to the upper pixel electrode 519. Since the upper pixel electrode 519 is formed above the lower pixel electrodes 517, photoelectrical conversion can be performed by applying a voltage to the organic photoelectric conversion film 518.

The eighth insulating film 520, the ninth insulating film 521, and the tenth insulating film 522 are stacked above the upper pixel electrode 519. In the present embodiment, titanium nitride (TiN), which is used for the lower pixel electrodes 517, is also used for the counter electrode 524.

It should be noted that a through via for connecting the uppermost interconnect layer and interconnects in the lower layers is not formed in the region where the upper pixel electrode 519 is formed. This can prevent electrical short circuit between the upper pixel electrode 519 and power supply line and between upper pixel electrode 519 and the pad, via the through via, in the region where the upper pixel electrode 519 is formed. Thus, a normal operation by a pixel cell can be ensured.

The peripheral circuit region 103 will be described.

A first Al plug 525 is formed in the sixth insulating film 514, the seventh insulating film 515, and the tenth insulating film 522 which are stacked above the third Cu layer 513. A global interconnect 526 is formed on the tenth insulating film 522 and the first Al plug 525. The global interconnect 526 is, for example, a power supply line for supplying a power supply voltage to a pixel circuit. The upper pixel electrode 519, the eighth insulating film 520, and the ninth insulating film 521 are not formed in the peripheral circuit region 103. This is because if the upper pixel electrode 519 is formed in the peripheral circuit region 103, the upper pixel electrode 519 and the first Al plug 525 are electrically short-circuited, and the upper pixel electrode 519 and the global interconnect 526 are also short-circuited, thereby prohibiting a pixel cell from normally operating.

The following describes the peripheral pad region 104.

A second Al plug 527 is formed in the sixth insulating film 514, the seventh insulating film 515, and the tenth insulating film 522 which are stacked above the third Cu layer 513. A first Al pad 528 is formed on the tenth insulating film 522 and the second Al plug 527. The first Al pad 528 is, for example, a pad for wire bonding. The upper pixel electrode 519, the eighth insulating film 520, and the ninth insulating film 521 are not formed in the peripheral pad region 104. This is because if the upper pixel electrode 519 is formed in the peripheral pad region 104, the upper pixel electrode 519 and the second Al plug 527 are electrically short-circuited, and the upper pixel electrode 519 and the first Al pad 528 are also short-circuited, thereby prohibiting a pixel cell from normally operating. Moreover, the upper pixel electrode 519 and the first Al plug 525 are electrically short-circuited. Then, the upper pixel electrode 519 and the global interconnect 526 are also short-circuited.

As the above structure, the global interconnect 526, the light shielding film 523, and the first Al pad 528 are disposed so that the top surfaces of the global interconnect 526, the light shielding film 523, and the first Al pad 528 are above the bottom surface of the organic photoelectric conversion film 518. This can independently determine the heights of the pixel plugs 516 without being affected by the global interconnect 526, the light shielding film 523, and the first Al pad 528. That is, it is possible to decrease the heights of the pixel plugs 516, and reduce a capacitance between adjacent pixels, thereby significantly suppressing the degradation of color mixture characteristics due to crosstalk.

It should be noted that the global interconnect 526, the light shielding film 523, and the first Al pad 528 have the same film thickness, for example. Moreover, the global interconnect 526, the light shielding film 523, and the first Al pad 528 include the same material(s), for example. Thus, it is possible to simplify the process of forming the uppermost interconnect layer which is formed after a photoelectric conversion film is formed. Therefore, if the organic photoelectric conversion film 518 includes an organic material, process damage to the organic photoelectric conversion film 518 can be reduced.

Moreover, the materials forming the global interconnect 526, the light shielding film 523, and the first Al pad 528 contain, for example, Al. This can lower the resistance of the global interconnect and improve adhesive strength of wire bonding and light shielding properties.

Moreover, the above multilayer interconnect structure contains, for example, Cu. This can achieve a high-speed operation by a low resistance material (Cu), and can further facilitate the sharing of a technology for manufacturing the material (Cu) also used in general semiconductor devices.

Figure 5:
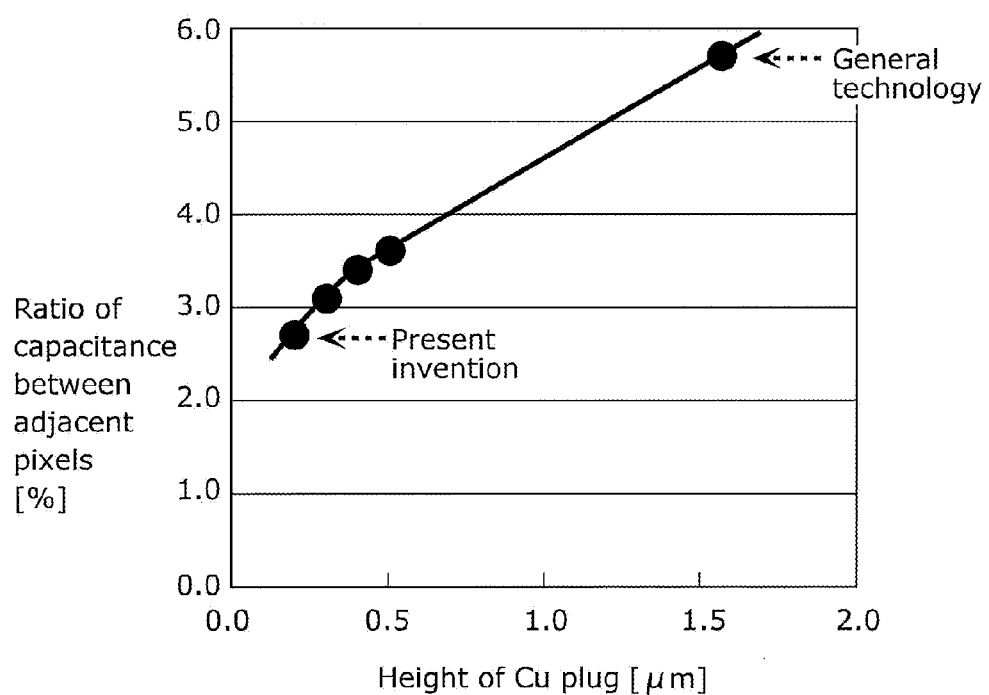
FIG. 5 is a graph representing a relationship between the height of a plug and a capacitance between pixels in the solid-state imaging device according to the embodiment.

FIG. 5 is a graph illustrating a relationship between the height of a plug and a capacitance between pixels in the solid-state imaging device according to the present embodiment. Specifically, FIG. 5 represents data on the ratio of a capacitance between adjacent pixels against the height of the pixel plug 516. Here, the ratio of a capacitance between adjacent pixels is the ratio of a capacitance between adjacent pixels to the total capacitance of a pixel part.

In a general solid-state imaging device, a global interconnect, a light shielding film, and an Al pad are positioned below an organic photoelectric conversion film. In this structure (the height of a Cu plug is 1.5 µm in FIG. 5), the ratio of a capacitance between adjacent pixels is 5.7%. If the ratio of a capacitance between adjacent pixels is 3% or lower, color mixture characteristics are considered excellent. However, it is clear from the figure that the ratio significantly exceeds 3% in the structure of the general and conventional solid-state imaging device.

In contrast, in the solid-state imaging device according to the embodiment of the present disclosure, the global interconnect 526, the light shielding film 523, and the first Al pad 528 are disposed above the organic photoelectric conversion film 518. In this case (the height of the Cu plug is 0.2 µm in FIG. 5), the ratio of a capacitance between adjacent pixels is 2.7%, satisfying the ratio at which the color mixture characteristics are excellent. Thus, the application of the solid-state imaging device according to the present embodiment can significantly improve the color mixture characteristics.

Furthermore, the height of the pixel plug 516 can be also decreased depending on a decrease in diameter of the pixel plug 516. This facilitates processing for a CU plug and the embedment of a metal material. Thus, a fine pixel can be easily made.

Moreover, this can independently determine the heights of the global interconnect 526, the light shielding film 523, and the first Al pad 528 without being affected by the pixel plugs 516. Thus, these heights can be increased for lowering interconnect resistance and improving light shielding properties and bonding resistance.

Furthermore, an Al pattern 529 is formed above an end 530 which is on the side where an end portion of the counter electrode region 102 is not opposite the pixel region 101 so that the Al pattern 529 is formed across the end 530. Moreover, in the end 530, the ends of the upper pixel electrode 519, the eighth insulating film 520, and the ninth insulating film 521 are at the same position.

Furthermore, in the solid-state imaging device 1 according to the present embodiment, the bottom surfaces of the global interconnect 526 and the first Al pad 528 are below bottom surface of the light shielding film 523. This can ensure certain film thicknesses (increase the film thicknesses) of the organic photoelectric conversion film 518, the upper pixel electrode 519, the eighth insulating film 520, and the ninth insulating film 521. Thus, excellent photoelectric conversion characteristics are ensured, which allows the insulating films to exhibit their protective properties.

Thus, in the solid-state imaging device according to the embodiment of the present disclosure, even in a pixel region with narrow pitch, characteristic degradation due to electrical color mixture resulted from the occurrence of crosstalk due to a capacitance between adjacent pixels can be solved.

[Method of Manufacturing Solid-state Imaging Device]

The following describes a method of manufacturing the solid-state imaging device according to the embodiment of the present disclosure.

Figure 7:
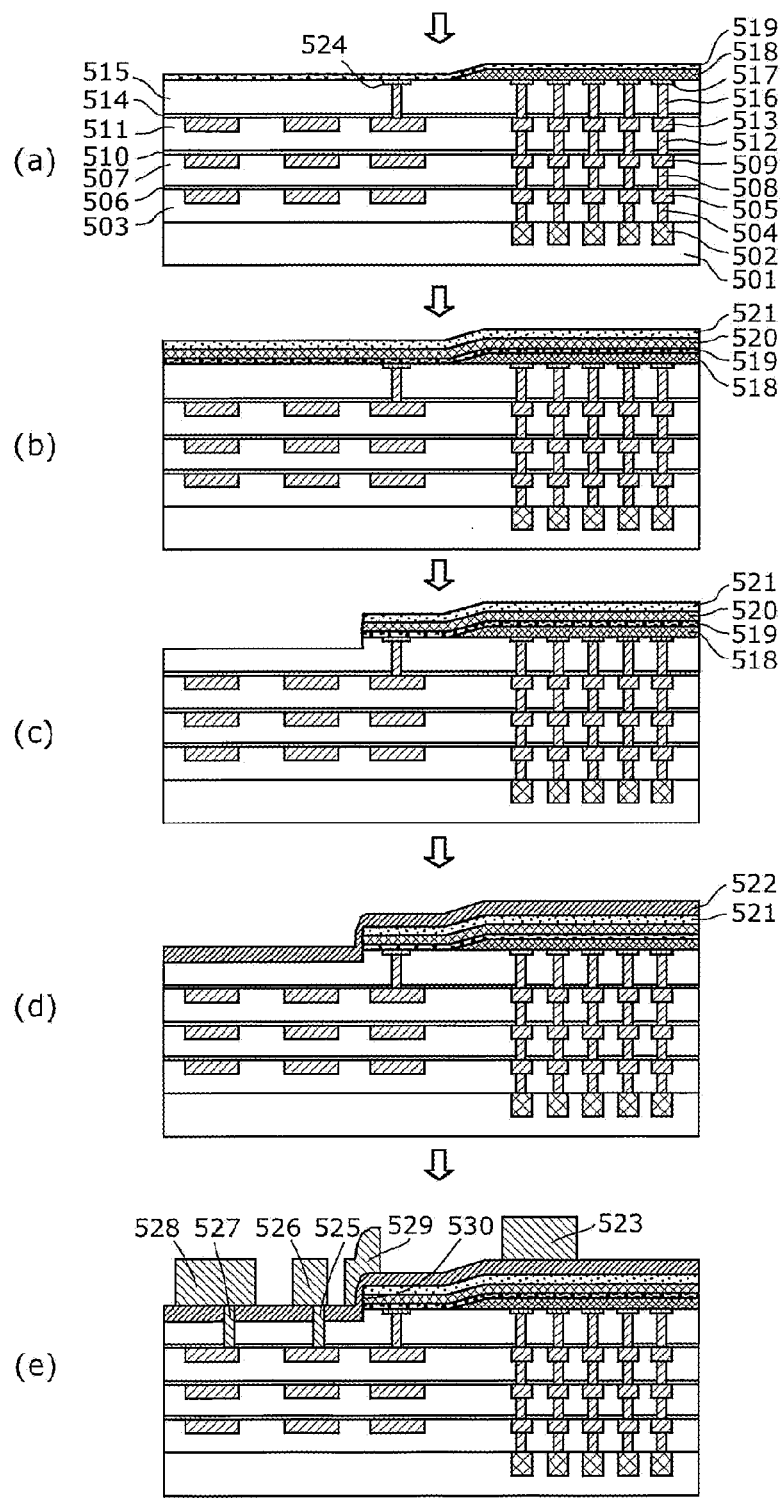
FIG. 7 is a cross-sectional view illustrating the second process in the method of manufacturing the solid-state imaging device according to the embodiment.
Figure 9:
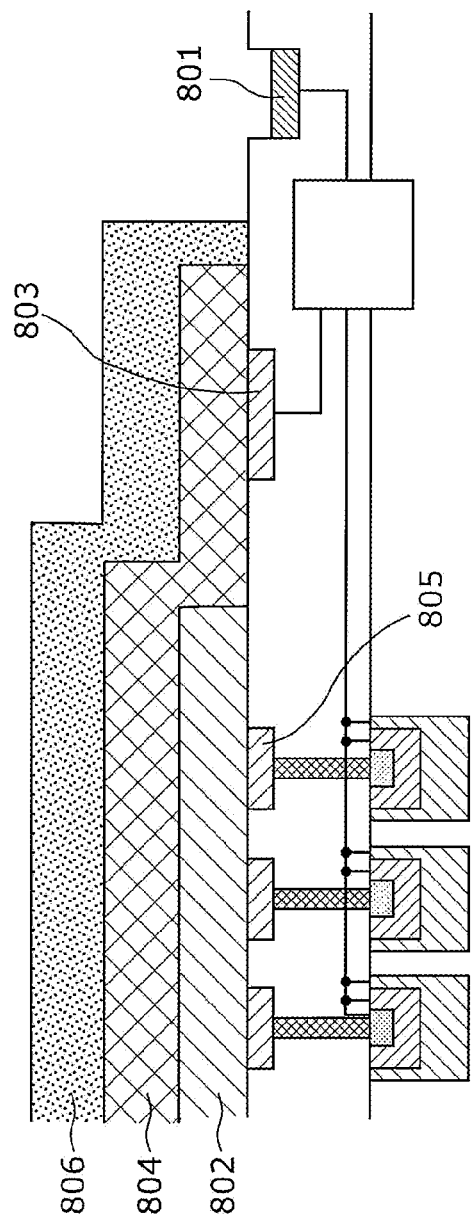
FIG. 9 is a cross-sectional view of the conventional solid-state imaging device disclosed in the patent literature.

FIG. 6 is a cross-sectional view illustrating the first process in the method of manufacturing the solid-state imaging device according to the embodiment. FIG. 7 is a cross-sectional view illustrating the second process in the method of manufacturing the solid-state imaging device according to the embodiment. In the method of manufacturing the solid-state imaging device according to the present embodiment, the first process illustrated in FIG. 6 is followed by the second process illustrated in FIG. 7. It should be noted that the following describes characteristic process subsequent to the process of forming the pixel plugs 516. Process prior to the process of forming the pixel plugs 516 can be performed in the same way as the process of forming a normal logic CMOS. Therefore, the explanation will be omitted.

Before the process of forming the pixel plugs 516 described below, the process of forming the charge accumulation and diffusion areas 502 in the silicon substrate 501 within the pixel region 101 is performed. Moreover, the first insulating film 503 to the third Cu layer 513 are formed after the process of forming the diffusion areas.

For instance, the sixth insulating film 514 having a film thickness of 60 nm and the seventh insulating film 515 are formed above the third Cu layer 513 by, for example, a chemical vapor deposition (CVD) method (illustrated in (a) in FIG. 6). The sixth insulating film 514 contains, for example, silicon nitride (SiN), silicon carbon nitride (SiCN), and silicon carbon oxide (SiCO). The seventh insulating film 515 contains, for example, silicon oxide ($SiO_2$) and carbon-doped silicon oxide (SiOC).

A first resist pattern having a first via pattern is formed above the sixth insulating film 514 and the seventh insulating film 515 by a lithography method (not illustrated in the figure).

The sixth insulating film 514 and the seventh insulating film 515 are dry-etched, using the first resist pattern as a mask, to form the pixel plugs 516 on the third Cu layer 513. The first resist pattern is then removed by ashing (not illustrated in the figure).

A first barrier metal film and a first metal film are successively deposited above the pixel plugs 516 by the CVD method and a physical vapor deposition (PVD) method (not illustrated in the figure). The first barrier metal film is formed by stacking tantalum nitride (TaN) and tantalum (Ta). The first metal film contains copper (Cu). Here, the first barrier metal may be formed with, for example, titanium (Ti) and titanium nitride (TiN). Moreover, the first metal film may be formed with tungsten (W).

Excessive portions of the first metal film and the first barrier metal film deposited above the top surfaces of the pixel plugs 516 are polished by a chemical-mechanical polishing (CMP) method. Thus, the pixel plugs 516 including the first barrier metal film and the first metal film are formed (illustrated in (b) in FIG. 6). That is, the pixel plugs 516 are formed above the charge accumulation and diffusion areas 502 to be electrically connected to the charge accumulation and diffusion areas 502.

A second metal film 601 having a film thickness of 130 nm is formed by successively depositing titanium (Ti) and titanium nitride (TiN) using the CVD method or PVD method. An eleventh insulating film 602 having a film thickness of 50 nm is formed by depositing silicon oxide ($SiO_2$) film on the second metal film 601 using the CVD method (not illustrated in the figure). Here, the eleventh insulating film 602 on the second metal film 601 is intended to suppress the exposure of the surface of the second metal film 601 to oxygen during ashing and to be used as a hard mask when etching the second metal film 601. The eleventh insulating film 602 does not have to be formed.

A second resist pattern having a pixel electrode pattern is formed on the eleventh insulating film 602, by the lithography method. The eleventh insulating film 602 on the second metal film 601 is dry-etched, using the second resist pattern as a mask. The second resist pattern is then removed by ashing (illustrated in (c) in FIG. 6). Here, a material forming the second metal film 601 may be an etchable metal such as titanium (Ti), tantalum (Ta), tantalum nitride (TaN), aluminum (Al), or tungsten (W), as described above. Moreover, the second metal film 601 may have a stacking structure of these.

A twelfth insulating film having a film thickness of 200 nm and containing silicon oxide ($SiO_2$) is formed by the CVD method and the PVD method, to cover the second metal film 601 (not illustrated in the figure).

The twelfth insulating film is polished by the CPM method or etched by an etch back method. This forms the lower pixel electrodes 517 and a counter electrode 524 having flat surfaces (illustrated in (d) in FIG. 6).

The organic photoelectric conversion film 518 having a film thickness of 500 nm is formed by a vacuum deposition method to coat the lower pixel electrodes 517 through a shadow mask. Here, the organic photoelectric conversion film 518 may have a stacking structure which is the combination of, for example, an electron blocking layer and a hole blocking layer. The organic photoelectric conversion film 518 is formed through the shadow mask, thereby rendering a pattern end indistinct. Thus, a predetermined space is necessary as described above. That is, at the end portion of the organic photoelectric conversion film 518, the organic photoelectric conversion film 518 continuously becomes thinner toward the periphery. Here, the organic photoelectric conversion film 518 is formed with the shadow mask. This is because if normal lithography or dry etching is performed, ashing with oxygen ($O_2$) and cleansing with a chemical solution degrade the film quality of the organic photoelectric conversion film 518. Moreover, the distance between the end portion of the organic photoelectric conversion film 518 and the lower pixel electrode 517 closest to the end portion needs to be at least 50 μm. Likewise, the distance between the end portion of the organic photoelectric conversion film 518 and the end of the counter electrode 524 needs to be at least 50 μm. The upper pixel electrode 519 is formed by the PVD method to cover the entire surface of a wafer (illustrated in (a) in FIG. 7). That is, the lower pixel electrodes 517, the organic photoelectric conversion film 518, and the upper pixel electrode 519, which are above and electrically connected to the pixel plugs 516, are stacked upward in this sequence.

The eighth insulating film 520 containing aluminum oxide (AlO) and having a film thickness of 30 nm and the ninth insulating film 521 containing silicon oxide nitride (SiON) and having a film thickness of 200 nm are formed to cover the organic photoelectric conversion film 518 (illustrated in (b) in FIG. 7). The organic photoelectric conversion film 518 is covered by the upper pixel electrode 519, but the upper pixel electrode 519 of ITO does not function as a protective film. Thus, the eighth insulating film 520 containing aluminum oxide (AlO) is employed which is formed by an atomic layer deposition (ALD) method with a low damage and a high passivation effect resulted from not using plasma. This film has a very excellent coverage characteristic. Thus, if foreign matter is on the organic photoelectric conversion film 518, exposure of the organic photoelectric conversion film 518 can be suppressed. For this reason, the film is preferable. Moreover, the ninth insulating film 521 is formed at a temperature of 200° C. or below and under the environment of a plasma emission wavelength of 350 nm or greater provided by using silane ($SiH_4$), nitrogen dioxide ($NO_2$), and ammonia ($NH_3$), thereby suppressing the damage to the organic photoelectric conversion film 518.

A third resist pattern is formed on the ninth insulating film 521 by the lithography method to cover the entirety of the pixel region 101 and the counter electrode region 102 (not illustrated in the figure).

The ninth insulating film 521 and the eighth insulating film 520 formed in the region other than the pixel region 101 and the counter electrode region 102 are removed by dry etching, using the third resist pattern as a mask. The third resist pattern is then removed by ashing (not illustrated in the figure).

Furthermore, the upper pixel electrode 519 is removed by dry etching, using the ninth insulating film 521 and the eighth insulating film 520 as masks (illustrated in (c) in FIG. 7).

Here, the following describes the patterning of the upper pixel electrode 519. FIG. 8A is a cross-sectional view illustrating a condition after the upper pixel electrode is dry-etched with a resist mask. In FIG. 8A, the ninth insulating film 521, the eighth insulating film 520, and the upper pixel electrode 519 are removed by dry etching, using the third resist pattern as a mask. The interface of an ITO film forming the upper pixel electrode 519 is unstable. Thus, when a third resist pattern 701 is removed by ashing, oxygen 702 enters the interface between the seventh insulating film 515 and the upper pixel electrode 519, and diffuses into the organic photoelectric conversion film 518. That is, the organic photoelectric conversion film 518 is exposed to the oxygen, thereby damaging the organic photoelectric conversion film 518.

FIG. 8B is a cross-sectional view illustrating a condition when the resist mask is removed by ashing. Moreover, FIG. 8C is a cross-sectional view illustrating a condition after the upper pixel electrode is dry-etched, using the upper-layer insulating films as masks. In the present disclosure, the etching as illustrated in FIG. 8B is performed to suppress the damage to the organic photoelectric conversion film 518 as illustrated in FIG. 8A. In FIG. 8B, before the interface between the seventh insulating film 515 and the upper pixel electrode 519 are exposed, the ninth insulating film 521 and the eighth insulating film 520 are etched using the third resist pattern 701 as a mask. The third resist pattern 701 is then removed by ashing. As illustrated in FIG. 8C, the upper pixel electrode 519 is removed using the ninth insulating film 521 and the eighth insulating film 520 as masks, instead of using a resist mask. This suppresses ashing in the state where the interface between the seventh insulating film 515 and the upper pixel electrode 519 are exposed.

Furthermore, by performing dry etching and ashing at a substrate temperature of 200° C. or below and under the environment of a plasma emission wavelength of 350 nm or greater, the damage to the organic photoelectric conversion film 518 can be suppressed, and the shadow mask method does not have to be used.

Moreover, the processing for the ninth insulating film 521 and the eighth insulating film 520 using the third resist pattern 701 as a mask and the processing for the upper pixel electrode 519 using the ninth insulating film 521 and the eighth insulating film 520 as masks create the structure in which the end faces of the ninth insulating film 521, the eighth insulating film 520, and the upper pixel electrode 519 are flush with each other. Moreover, the end face of the upper pixel electrode 519 is perpendicular to the substrate or is inclined against and forms an angle of 45 degrees or more with the substrate. In other words, the end face of the upper pixel electrode 519 and the end faces of the protective films (the ninth insulating film 521 and the eighth insulating film 520) are on the same line in the layout.

In the conventional solid-state imaging device including a general photoelectric conversion film (FIG. 3), the upper pixel electrode is formed using a shadow mask. Thus, the distance D4 between the end portion 303 of the upper pixel electrode 206 and the electrode connected to a counter electrode 301 needs to be 150 μm or longer. The distance D5 between the end portion 303 and the peripheral pad 204 needs to be 150 μm or longer. In contrast, in the solid-state imaging device 1 according to the present embodiment, the end face of the upper pixel electrode 519 are on the same plane with the end face of the eighth insulating film 520. Moreover, the end face of the upper pixel electrode 519 and the end face of the eighth insulating film 520 form an angle of 45 degrees or more with the surface of the silicon substrate 501. This can decrease, to 5 μm or less, both of the distance between the end portion 530 of the upper pixel electrode 519 and the counter electrode 524 and the distance between the end portion 530 and the global layer 526 in the peripheral circuit region 103. Thus, it is possible to decrease the distance between the peripheral circuit region 103 and the counter electrode 524 and the distance between the peripheral circuit region 103 and the lower pixel electrodes 517. Therefore, a voltage decline can be suppressed in supplying, for example, a power supply voltage, which allows a pixel cell to stably operate. Furthermore, an unnecessary region which does not contribute to a circuit operation can be removed. Thus, the area of a chip can be reduced.

The tenth insulating film 522 containing silicon oxide nitride (SiON) and having a film thickness of 400 nm is formed by the CVD method (illustrated in (d) in FIG. 7). This can protect the side surfaces of the seventh insulating film 515 and the upper pixel electrode 519. The tenth insulating film 522 is formed at a temperature of 200° C. or below, using silane ($SiH_4$), nitrogen dioxide ($NO_2$), and ammonia ($NH_3$). The tenth insulating film 522 is formed under the environment of a plasma emission wavelength of 350 nm or greater, thereby suppressing the damage to the organic photoelectric conversion film 518.

The fourth resist pattern having the fourth via pattern for forming the first Al plug 525 and the second Al plug 527 is formed on the tenth insulating film 522 by the lithography method. Here, the first Al plug 525 connects the third Cu layer 513 and the global interconnect 526. The second Al plug 527 connects the third Cu layer 513 and the first Al pad 528.

The fourth via pattern is formed by dry etching, using the fourth resist pattern as a mask. The fourth resist pattern is then removed by ashing (not illustrated in the figure). Here, by performing dry etching and ashing at a substrate temperature of 200° C. or below and under the environment of a plasma emission wavelength of 350 nm or greater, the damage to the organic photoelectric conversion film 518 is suppressed.

A third metal film having a film thickness of 600 nm is formed by the PVD method, as a layered film of titanium (Ti), titanium nitride (TiN), and aluminum (Al) (not illustrated in the figure). Here, the third metal film is formed at a temperature of 200° C. or below and under the environment of a plasma emission wavelength of 350 nm or greater, thereby suppressing the damage to the organic photoelectric conversion film 518.

The fifth resist pattern having the patterns of the light shielding film 523, the global interconnect 526, and the first Al pad 528 to be formed in a particular pixel region is formed on the third metal film by the lithography method (not illustrated in the figure).

The third metal film is dry-etched using the fifth resist pattern as a mask, to form the first Al pad 528, the global interconnect 526, and the light shielding film 523 (illustrated in (e) in FIG. 7). That is, after forming the organic photoelectric conversion film 518, the first Al pad 528, the global interconnect 526, and the light shielding film 523, which are the interconnects in the uppermost layer of the multilayer interconnect structure disposed in the peripheral region of the pixel region 101, are formed such that the top surface of the interconnects are above the bottom surface of the organic photoelectric conversion film 518. The fifth resist pattern is then removed by ashing. Here, by performing dry etching and ashing at a substrate temperature of 200° C. or below and under the environment of a plasma emission wavelength of 350 nm or greater, the damage to the organic photoelectric conversion film 518 is suppressed. Thus, the first Al pad 528, the global interconnect 526, and the light shielding film 523 can be formed concurrently. Furthermore, the first Al pad 528, the global interconnect 526, and the light shielding film 523 are formed after the pixel plugs 516 are formed. Thus, the heights of the pixel plugs 516 can be independently determined without being affected by the first Al pad 528, the global interconnect 526, and the light shielding film 523.

Furthermore, the Al pattern 529 is formed with the fifth resist pattern to avoid (i) the film reduction during etching of the tenth insulating film 522 above the end 530 of the ninth insulating film 521, the eighth insulating film 520, and the upper pixel electrode 519, and (ii) the exposure of the interface between the seventh insulating film 515 and the upper pixel electrode 519. That is, the ring-shaped Al pattern 529 is formed above the end portion of the upper pixel electrode 519 so as to surround the pixel region 101 in a plan view of the silicon substrate 501. This method enables processing by lithography and etching after the organic photoelectric conversion film 518 is formed, and can avoid using the shadow mask method in the process subsequent to the process of forming the organic photoelectric conversion film 518. Here, the Al pattern 529 can suppress the film reduction of the tenth insulating film 522 during the dry-etching of the global interconnect 526, the light shielding film 523, and the first Al pad 528. This can prevent the side surfaces of the ninth insulating film 521, the eighth insulating film 520, and the upper pixel electrode 519 from being exposed.

Moreover, the Al pattern 529 is formed in a ring shape to surround the pixel region 101 and the counter electrode regions 102, and is in an electrically floating state. Thus, even if the upper pixel electrode 519 and the Al pattern 529 are electrically short-circuited, sufficient distances between the Al pattern 529 and the first Al pad 528, between the Al pattern 529 and the global interconnect 526, and between the Al pattern 529 and the light shielding film 523 are secured. Thus, electrical short circuit between the upper pixel electrode 519 and each of the first Al pad 528, the global interconnect 526, and the light shielding film 523 can be prevented, thereby securing a normal operation by a pixel cell.

In the solid-state imaging device and the method of manufacturing the same according to the present disclosure, it is possible to decrease the heights of the pixel plugs 516, reduce a capacitance between adjacent pixels, and significantly suppress the degradation of color mixture characteristics due to crosstalk.

Furthermore, the height of the pixel plug 516 can be decreased depending on a decrease in diameter of the pixel plug 516. This can facilitate processing for a Cu plug and the embodiment of a metal material. Thus, a fine pixel can be easily made.

It should be noted that the process subsequent to the process of forming an organic photoelectric conversion film is performed at a temperature of 200° C. or below. Thus, a reduction in interconnect reliability of the global interconnect 526 and a reduction in insulation resistance of the eighth insulating film 520, the ninth insulating film 521, and the tenth insulating film 522 are concerned. However, the reduction in interconnect reliability of the global interconnect 526 can be prevented by changing the interconnect structure of the global interconnect 526, more specifically, by forming the global interconnect 526, i.e., the uppermost layer to be a TiN layer or thickening the interconnect, for example. Moreover, thickening the insulating film can suppress the reduction in insulating resistance of the eighth insulating film 520, the ninth insulating film 521, and the tenth insulating film 522.

Moreover, the method of manufacturing the solid-state imaging device according to the present embodiment can form an organic photoelectric conversion film with a pattern by adhering a wafer to a shadow mask with a wafer-size hole, and depositing the organic photoelectric conversion film. This makes the processing for the organic photoelectric conversion film unnecessary. Moreover, the shadow mask and wafer are mechanically adhered when the organic photoelectric conversion film is formed. Thus, there is the following possibility. The organic photoelectric conversion film becomes thinner toward the end as the end face is inclined. This deteriorates the accuracy of stacking. However, in the process subsequent to the process of forming an upper pixel electrode, a film is formed at a low temperature by a method other than the shadow mask method, in a way that the organic photoelectric conversion film is not damaged. Thus, there is no need to secure a long distance between a pixel region and regions peripheral to the pixel region.

The solid-state imaging device and method of manufacturing the same according to the present embodiment can reduce a coupling capacitance between the adjacent pixels and improve color mixture characteristics. Moreover, an electrode pad, a power supply line, and a light shielding film can be formed concurrently. Moreover, a finer pixel cell and a global interconnect with low resistance (thick interconnect film) can be formed. This can eliminate a limitation on the film thickness of the global interconnect. Thus, the peripheral circuit region between the pixel region and the pad can be effectively used.

It should be noted that an organic material is used for the photoelectric conversion film in the present embodiment. However, the advantages of the preset disclosure can be obviously obtained even if other material (such as an inorganic material) is used.

The solid-state imaging device and the method of manufacturing the same according to the present disclosure were described above, based on the embodiment. However, the solid-state imaging device and the method of manufacturing the same according to the present disclosure are not limited to the above embodiment. The present disclosure includes another embodiment achieved by optionally combining the structural elements in the above embodiment, a modification obtained by making various modifications which those skilled in the art would conceive to the above embodiment, without departing from the scope of the present disclosure, and various apparatuses including the solid-state imaging device according to the present disclosure.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The present disclosure is achieved as a solid-state imaging device in which color mixture is reduced between pixels even if a large number of pixels are used. Furthermore, the present disclosure is preferable as an imaging device such as a camera module for a mobile device such as a cellular phone.

The invention claimed is:

1. A solid-state imaging device comprising:
a pixel region in which a plurality of pixels are disposed in a matrix above a semiconductor substrate; and
a peripheral region in which a multilayer interconnect structure for driving the plurality of pixels is formed, the peripheral region being peripheral to the pixel region in a plan view of the semiconductor substrate,
wherein the pixel region includes:
a charge accumulation and diffusion layer in the semiconductor substrate;
a plurality of pixel plugs formed above and electrically connected to the charge accumulation and diffusion layer, the plurality of pixel plugs respectively corresponding to the plurality of pixels;
a plurality of lower pixel electrodes formed on and electrically connected to the plurality of pixel plugs, respectively, the plurality of lower pixel electrodes respectively corresponding to the plurality of pixels;
a photoelectric conversion film formed on and electrically connected to the plurality of lower pixel electrodes; and
an upper pixel electrode formed on and electrically connected to the photoelectric conversion film, and
a top surface of an interconnect formed in an uppermost layer of the multilayer interconnect structure disposed in the peripheral region is above a bottom surface of the photoelectric conversion film.

2. The solid-state imaging device according to claim 1, wherein the interconnect formed in the uppermost layer includes power supply line for supplying a power supply voltage to a circuit and a pad for wire bonding.

3. The solid-state imaging device according to claim 2, wherein the power supply line, the pad, and a light shielding film for partially shielding the plurality of pixels have a same film thickness.

4. The solid-state imaging device according to claim 2, wherein the power supply line, the pad, and a light shielding film for partially shielding the plurality of pixels include a same material.

5. The solid-state imaging device according to claim 4, wherein the material included in the power supply line, the pad, and the light shielding film contains Al.

6. The solid-state imaging device according to claim 3, wherein bottom surfaces of the power supply line and the pad are below a bottom surface of the light shielding film.

7. The solid-state imaging device according to claim 1, wherein the multilayer interconnect structure contains Cu.

8. The solid-state imaging device according to claim 1, wherein the plurality of lower pixel electrodes contain Ti or a chemical compound of Ti.

9. The solid-state imaging device according to claim 1, wherein the plurality of pixel plugs contain Cu.

10. The solid-state imaging device according to claim 1, wherein ring-shaped pattern is also disposed above an end portion of the upper pixel electrode to surround the pixel region in the plan view of the semiconductor substrate.

11. The solid-state imaging device according to claim 1, further comprising
a protective film on the upper pixel electrode, for protecting the upper pixel electrode and the photoelectric conversion film,
wherein an end face of the upper pixel electrode is on a same plane with an end face of the protective film, and the end face of the upper pixel electrode and the end face of the protective film form an angle of 45 degrees or more with a surface of the semiconductor substrate.

12. The solid-state imaging device according to claim 1, wherein at an end portion of the photoelectric conversion film, the photoelectric conversion film continuously becomes thinner toward a periphery.

13. The solid-state imaging device according to claim 1, wherein in the plan view of the semiconductor substrate, the upper pixel electrode is formed to cover the plurality of lower pixel electrodes.

14. A method of manufacturing a solid-state imaging device, the method comprising:
forming a charge accumulation and diffusion layer in a semiconductor substrate in a pixel region in which a plurality of pixels are disposed in a matrix above the semiconductor substrate;
forming a pixel plug to be positioned above and electrically connected to the charge accumulation and diffusion layer;
forming, in the following sequence, a lower pixel electrode, a photoelectric conversion film, and an upper pixel electrode in a stack, to be positioned above and electrically connected to the pixel plug; and
after forming the photoelectric conversion film, forming an interconnect in an uppermost layer of a multilayer interconnect structure so that a top surface of the interconnect is above a bottom surface of the photoelectric conversion film, the multilayer interconnect structure being disposed in a peripheral region peripheral to the pixel region in a plan view of the semiconductor substrate.

15. The method of manufacturing a solid-state imaging device according to claim 14,
wherein in the forming of the photoelectric conversion film, the photoelectric conversion film is formed by a shadow mask method, and
in each process subsequent to the forming of the photoelectric conversion film, dry etching and ashing are performed at a substrate temperature of 200° C. or below and a plasma emission wavelength of 350 nm or greater.

* * * * *